(12) United States Patent
Raaijmakers et al.

(10) Patent No.: US 6,232,196 B1
(45) Date of Patent: May 15, 2001

(54) METHOD OF DEPOSITING SILICON WITH HIGH STEP COVERAGE

(75) Inventors: Ivo Raaijmakers, Phoenix, AZ (US); Christopher François Lilian Pomarède, Pigman (FR); Cornelius Alexander van der Jengd, Portland, OR (US); Alexander Gschwandtner; Andreas Grassl, both of Munich (DE)

(73) Assignee: ASM America, Inc., Phoenix, AR (US)

( * ) Notice: Subject to any disclaimer, the term of this patent is extended or adjusted under 35 U.S.C. 154(b) by 0 days.

(21) Appl. No.: 09/264,167

(22) Filed: Mar. 5, 1999

Related U.S. Application Data
(60) Provisional application No. 60/077,082, filed on Mar. 6, 1998.

(51) Int. Cl.⁷ .................................................... H01L 21/20
(52) U.S. Cl. ............................................. 438/386; 438/243
(58) Field of Search ................................... 438/386–392, 438/243–249, 361, 488, 491

(56) References Cited

U.S. PATENT DOCUMENTS

| | | | |
|---|---|---|---|
| 5,075,749 | 12/1991 | Chi et al. | 357/30 |
| 5,198,387 | * 3/1993 | Tang | 437/101 |
| 5,324,684 | * 6/1994 | Kermani et al. | 437/95 |
| 5,607,511 | 3/1997 | Meyerson | 118/725 |
| 5,876,797 | * 3/1999 | Beinglass et al. | 427/255.1 |

OTHER PUBLICATIONS

C.R. Kleijn, "A Mathematical Model of the Hydrodynamics and Gas–Phase Reactions in Silicon LPCVD in a Singl–Wafer Reactor", J. Electrochem. Soc., vol. 138, No. 7, Jul. 1991, pp. 2190–1200.

* cited by examiner

Primary Examiner—David Nelms
Assistant Examiner—Quoc Hoang
(74) Attorney, Agent, or Firm—Knobbe, Martens, Olson & Bear LLP

(57) ABSTRACT

A method is disclosed for depositing silicon with high deposition rates and good step coverage. The process is performed at high pressures, including close to atmospheric pressures, at temperatures of greater than about 650° C. Silane and hydrogen are flowed over a substrate in a single-wafer chamber. Advantageously, the process maintains good step coverage and high deposition rates (e.g., greater that 50 nn/min) even when dopant gases are added to the process, resulting in commercially practicable rates of deposition for conductive silicon. Despite the high deposition rates, step coverage is sufficient to deposit polysilicon into extremely deep trenches and vias with aspect ratios as high as 40:1, filling such structures without forming voids or keyholes.

32 Claims, 6 Drawing Sheets

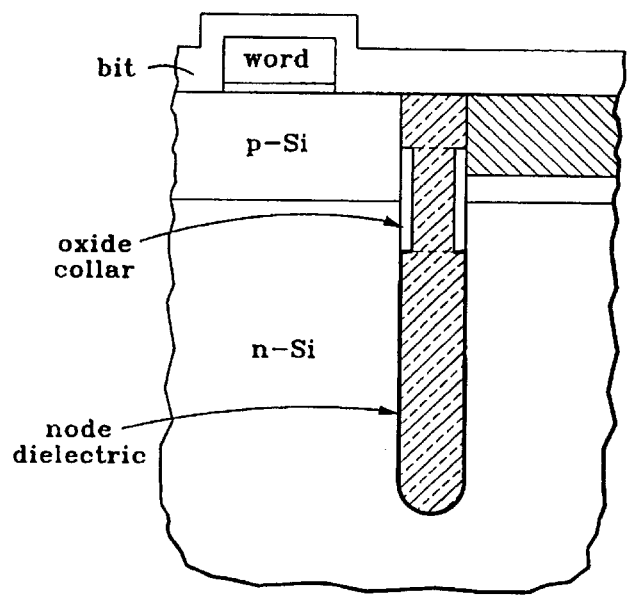
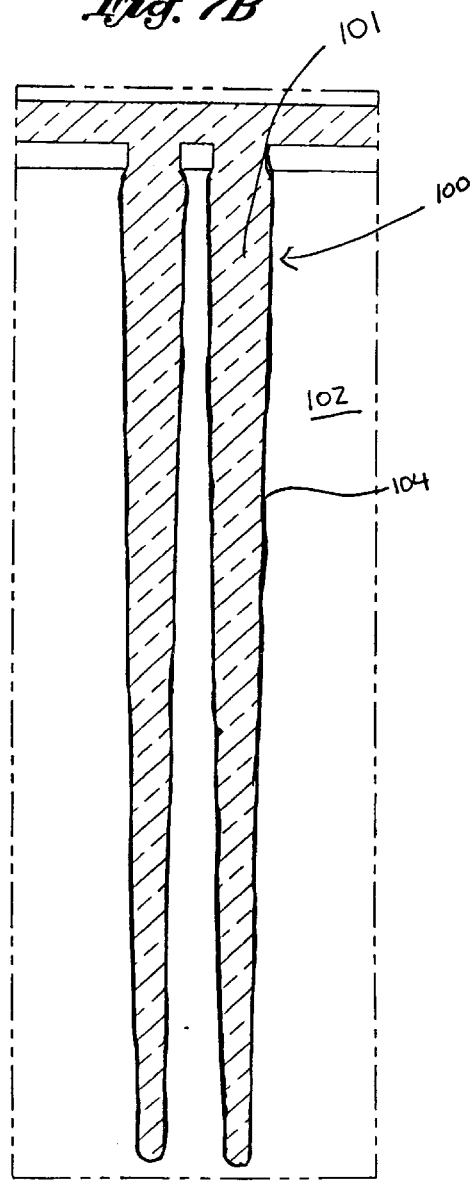

METHOD OF DEPOSITING SILICON WITH HIGH STEP COVERAGE

REFERENCE TO RELATED APPLICATION

This application claims the priority benefit under 35 U.S.C. § 119(e) from provisional application No. 60/077,082 of Raaijmakers et al., filed Mar. 6, 1998.

FIELD OF THE INVENTION

The present invention relates generally to depositing silicon, and particularly to the chemical vapor deposition of conductively doped silicon with high step coverage.

BACKGROUND OF THE INVENTION

As a semiconducting material, silicon is currently the most popular material from which to fabricate transistors in integrated circuits. Through selective doping of different areas on a silicon substrate, source, drain and channel regions of different conductivity types and levels can be formed in the silicon substrate. Typically, the substrate comprises a monocrystalline silicon wafer, or an epitaxial silicon layer formed thereon. Either the entire substrate (wafer or epitaxial layer) or a region known as a "well" is provided with a relatively low level of background doping of a first conductivity type (e.g., p-type). Source and drain regions can then be defined within that region by heavily doping with dopants of an opposite conductivity type (e.g., n-type source/drain regions within p-wells). Sub-regions are often also formed within the transistor area, with different levels, grading and types of dopants, in order to tailor the electrical characteristics of the resulting electronic devices.

Because silicon most often forms or is part of the base semiconducting layer in which transistors are formed, silicon is also often used in the fabrication of associated circuit elements. Particularly where the circuit element makes direct contact with the silicon substrate, silicon is a preferred material since it is electrically compatible with and forms ohmic contact with the substrate. Many metal materials, in contrast, can poison or interfere with the electrical characteristics of active areas. Other advantages of silicon, such as its high melting point and, therefore, ability to withstand later high-energy steps such as glass reflow or dopant implantation, favor use of silicon for still other applications.

Accordingly, silicon is often used for formation of transistor gate electrodes, capacitor electrodes, metal-to-substrate contacts, conductive plugs between wiring layers, etc. Unfortunately, many of these applications require coverage of steep steps in the topography of the in-process integrated circuit. For example, capacitors are often formed in trenches within the silicon substrate (trench capacitors) or in integrated structures above the substrate (stacked capacitors). Contact plugs, whether they are formed between two wiring layers or from one wiring layer to the substrate, are formed within holes etched through an insulating layer.

In each of these applications, the aspect ratio (height:width) of the structure continues to increase as device density is increased in pursuit of ever-faster and smaller integrated circuits. In general, the higher the aspect ratio, the more difficult it is to evenly cover vertical side walls and the bottom of the contact opening, via, or trench structure at issue. Completely filling such structures is even more difficult. Deposited layers tend to build more quickly at the lip of openings, closing off the opening before the hole is filled. This results in voids or keyholes within the hole.

Polycrystalline silicon (polysilicon, or simply poly) can be deposited by chemical vapor deposition (CVD). CVD silicon is favored over physical vapor deposition (PVD) of conductive materials, such as most metals, for its step coverage into high aspect ratio holes. On the other hand, silicon must be doped for conductivity and ohmic contact, which adds to the expense of forming silicon layers. Such expense is particularly high where the doping is conducted after formation of the silicon layer, such as through implantation or diffusion. Post-formation doping increases costs through a reduction of throughput due to the additional step or steps required for the doping. Additional costs are imposed by the need to protect other existing structures from high-energy dopant implantation or from high-temperature prolonged diffusion steps. Moreover, it is often technically difficult to adequately dope deep silicon plugs, for example, after the structure has been formed.

While processes for in situ doping silicon layers (that is, adding dopants during deposition of the silicon) are known, in situ doping is generally impractical for applications requiring high step coverage. It has been found that the addition of dopant gases to the reactants in CVD of silicon tends to reduce step coverage. Lowering the deposition rate can help in improving step coverage, for instance by lowering the temperature and/or pressure during the deposition, as a general proposition. Even such improvements in step coverage, however, are inadequate for covering or filling high aspect ratio holes of current and future generation integrated circuits. Furthermore, the reduction in throughput caused by lowering deposition rates makes this option unattractive, particularly where additional doping steps will be required after the deposition.

Accordingly, a need exists for a process for depositing silicon into holes or trenches having high aspect ratios with good step coverage and at acceptable rates of deposition. Desirably, such processes should permit in situ doping of the silicon, to avoid the need for further doping steps.

SUMMARY OF THE INVENTION

Methods are disclosed herein for depositing amorphous and/or polycrystalline silicon layers at high pressures. Advantageously, high step coverage can be obtained in holes of high aspect ratios, while maintaining temperatures high enough to achieve commercially acceptable rates of deposition.

In the illustrated embodiment, silane and hydrogen flow in a single-wafer process chamber under atmospheric pressure. At temperatures of 650° C., for example, deposition rates higher than 50 nm/min can be achieved with in situ doping, and higher than about 100 nm/min for undoped silicon. Such high deposition rates are achievable even while filling extremely high aspect ratio vias with excellent step coverage. For example, capacitor trenches having widths of 0.25 $\mu$m and depths of 7 to 7.5 $\mu$m were filled without voids with polysilicon by the methods disclosed herein.

In accordance with one aspect of the invention, therefore, methods are provided for depositing silicon at greater than about 500 Torr chamber pressure, while flowing process gases with a residence time of less than about 100 seconds.

In accordance with another aspect of the invention, a process is provided for depositing a non-epitaxial silicon layer by chemical vapor deposition. A substrate is placed into a single-wafer processing reaction chamber. The substrate temperature is raised to a reaction temperature between about 625° C. and 850° C., and process gases including a silicon source gas and a hydrogen carrier gas are introduced to the reaction chamber. The process gases flow over the substrate while the reaction chamber is maintained at a pressure of greater than about 700 Torr.

In accordance with another aspect of the invention, a method is provided for depositing silicon by chemical vapor deposition. A semiconductor substrate, including a plurality of holes, is loaded into a reaction chamber. The holes have openings of no more than about 0.5 µm and aspect ratios of greater than about 2:1. The substrate temperature is ramped to a desired reaction temperature. The chamber pressure pressure is maintained at greater than about 700 Torr, and a silane-based silicon source gas, a hydrogen carrier gas, and a dopant source gas flow simultaneously over the substrate within the reaction chamber at the desired reaction temperature. An in situ conductively doped silicon layer is thereby deposited over the substrate and into the holes, exhibiting greater than about 70% step coverage of the holes.

In accordance with another aspect of the invention, a method is disclosed for forming an integrated circuit. A substrate is provided with a hole having greater than a 2:1 aspect ratio. The substrate is loaded into a single-wafer processing chamber, and silicon is deposited into the hole at a rate of at least about 50 nm/min, with greater than about 80% step coverage.

In accordance with another aspect of the invention, an integrated capacitor is formed in trench having a width of no more than about 0.25 µm and an aspect ratio greater than about 20:1. The capacitor includes a dielectric layer lining the trench; and a conductively doped polysilicon layer filling the trench.

BRIEF DESCRIPTION OF THE DRAWINGS

These and further aspects of the invention will be readily apparent to the skilled artisan from the following description and the attached drawings, wherein:

FIG. 7A is a schematic view of a trench capacitor filled with polysilicon by a preferred method; and FIG. 7B replicates a micrograph of actual trench capcitors, filled with polysilicon in accordance with the preferred methods.

DETAILED DESCRIPTION OF THE PREFERRED EMBODIMENT

Preferred Reactor

Figure 1:
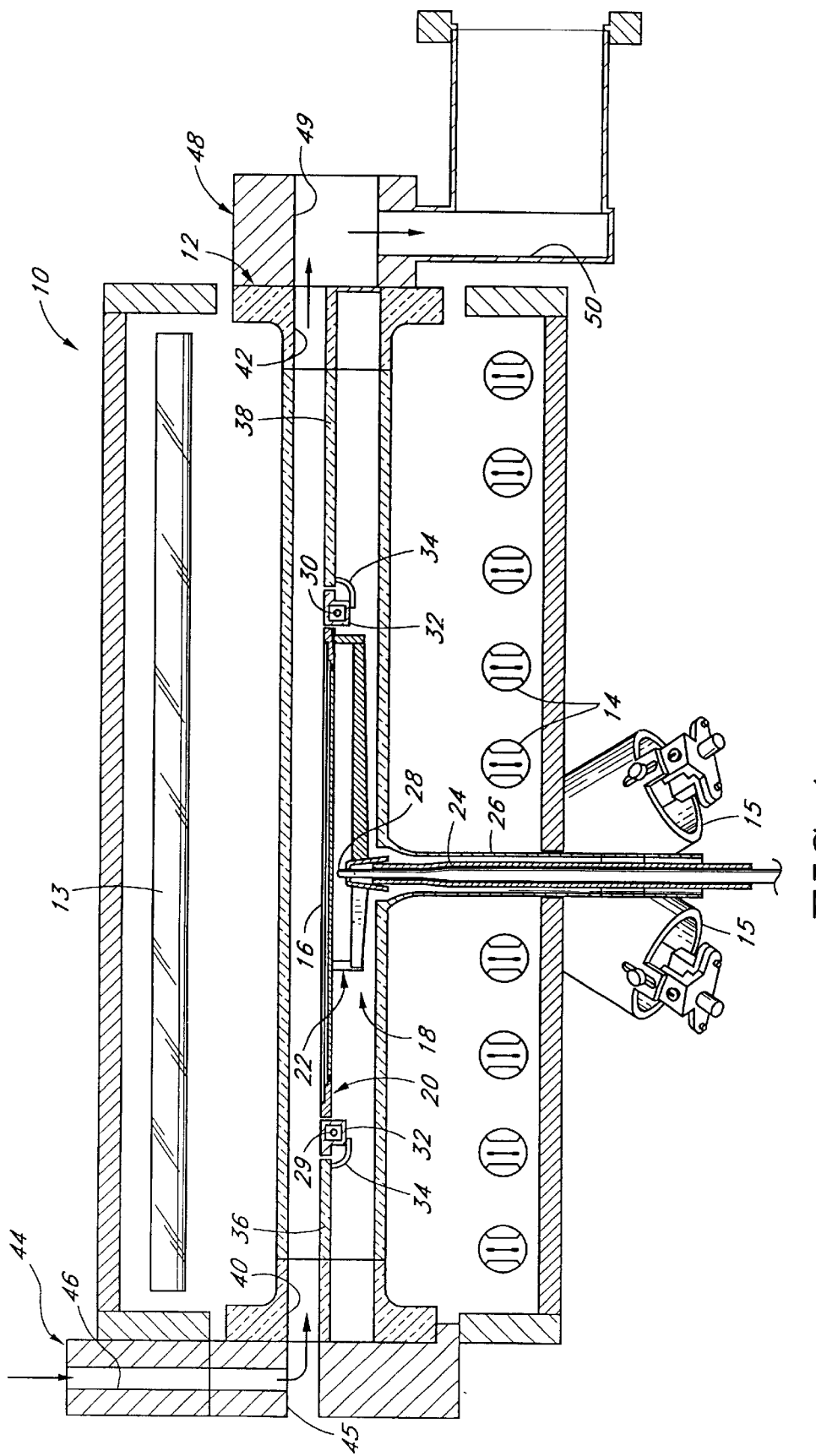
FIG. 1 is a schematic sectional view of an exemplary single-substrate reaction chamber, including some surrounding reactor components, for use with a preferred embodiment of the present invention.

FIG. 1 shows a chemical vapor deposition (CVD) reactor 10, including a quartz process or reaction chamber 12, constructed in accordance with a preferred embodiment, and for which the methods disclosed herein have particular utility. While the preferred embodiments are discussed in the context of a single-substrate CVD reactor, it will be understood that the disclosed processes will have application in CVD reactors of other types, having reaction chambers of different geometries from those discussed herein.

A plurality of radiant heat sources are supported outside the chamber 12, to provide heat energy to the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating. The construction of the preferred chamber 12 will be discussed in more detail with regard to FIGS. 2 and 3.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates above and below the upper and lower lamps 13, 14, respectively. Additionally, a plurality of spot lamps 15 supply concentrated heat to the underside of the wafer support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A substrate, preferably comprising a silicon wafer 16, is shown supported within the reaction chamber 12 upon a substrate or wafer support structure 18. Note that, while the substrate of the illustrated embodiment is a single-crystal silicon wafer, it will be understood that the term "substrate" broadly refers to any structure on which a layer is to be deposited. The deposition methods disclosed herein are of particular utility where the substrate includes steps in the topography of the surface over which layers are to be deposited, as will be clear from the disclosure below.

The illustrated support structure 18 includes a susceptor or wafer holder 20, upon which the wafer 16 rests, and a support spider 22. The spider 22 is mounted to a shaft 24, which extends downwardly through a tube 26 depending from the chamber 12 lower wall. Preferably, the tube 26 communicates with a source of purge gas which can flow during processing, inhibiting process gases from escaping to backside of the wafer 16. The preferred shaft 24 is mechanically connected to a motor (not shown) below the reaction chamber 12 (FIG. 1), for imparting rotation to the shaft 24, spider 22, wafer holder 20 and ultimately to the wafer 16.

A plurality of temperature sensors are positioned in proximity to the wafer 16. The temperature sensors may take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature at positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through upon the spider 22 in proximity to the wafer holder 22. The reactor 10 further includes a plurality of secondary or peripheral thermocouples, also in proximity to the wafer 16, including a leading edge or front thermocouple 30, a trailing edge or rear thermocouple 31, and a side thermocouple 31 (not shown). Each of the peripheral thermocouples are housed within a ring 32 which surrounds the wafer holder 20 and wafer 16. Each of the central and peripheral thermocouples are connected to a temperature controller, which sets the power of the various heating elements 14 in response to the readings of the thermocouples.

In addition to housing the peripheral thermocouples, the ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. Accordingly, the ring 32 promotes temperature uniformity across the wafer 16 during processing. The ring 32 can be suspended by any suitable means. For example, the illustrated ring 32 rests upon elbows 34 that depend from an upstream on front chamber divider 36 and a downstream or rear chamber divider 38. The dividers 36, 38 desirably are formed of quartz. In the illustrated chamber 12, these dividers 36, 38 not only define an upper process portion of the chamber 12, but can also provide structural support if the chamber is to be operated at reduced pressures, as will be more fully discussed with respect to FIGS. 2 to 4.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and outlet 42.

An inlet component 44 is fitted to the reaction chamber, adapted to surround the inlet port 40, and includes a horizontally elongated slot 45 through which the wafer 16 can be inserted. A generally vertical inlet 46 receives gases from remote sources, and communicates such gases with the slot 45 and the inlet port 40. The inlet 46 can include gas injectors (not shown) as described in U.S. Pat. No. 5,221,556, issued Hawkins, et al., the disclosure of which is hereby incorporated by reference. Such injectors include adjustable needle valves to tailor gas flow for the single-wafer reactor until uniform deposition is achieved.

The reactor also includes remote sources of process gases, which communicate with the inlet 46 via gas lines with attendant safety and control valves, as well as mass flow controllers ("MFCs") that are coordinated at a gas panel, as will be understood by one of skill in the art. Gas sources include a silicon-containing gas, preferably a silane such as monosilane ($SiH_4$), disilane ($Si_2H_6$), dichlorosilane (DCS or $SiH_2Cl_2$), trichlorosilane (TCS or $SiHCl_3$), or other silane or halosilane silicon sources. The silicon source can include a bubbler and a gas line for bubbling $H_2$ through a liquid solution such as TCS, to more effectively transport silicon-containing gas molecules to the reaction chamber in gaseous form. The illustrated reactor 10 also includes other source gases, such as dopant gases, including phosphine ($PH_3$), arsine ($AsH_3$), and/or diborane ($B_2H_6$); etchants for cleaning the reactor walls (e.g., HCl); a germanium source for doping or formation of SiGe films; ammonia ($NH_3$); etc.

An outlet component 48 mounts to the process chamber 12 such that an exhaust opening 49 aligns with the outlet port 42 and leads to exhaust conduits 50. The conduits 50, in turn, communicate with suitable vacuum means (not shown) for drawing process gases through the chamber 12. In one embodiment, process gases are drawn through the reaction chamber and a downstream scrubber without the aid of a pump. Such a reactor is not configured with a vacuum chamber, as that term is understood in the art of chemical vapor deposition. With the illustrated reinforced chamber 12, however, a pump or fan (not shown) can be included to aid in drawing process gases through the chamber 12, and to reduce pressure if desired.

Figure 2:
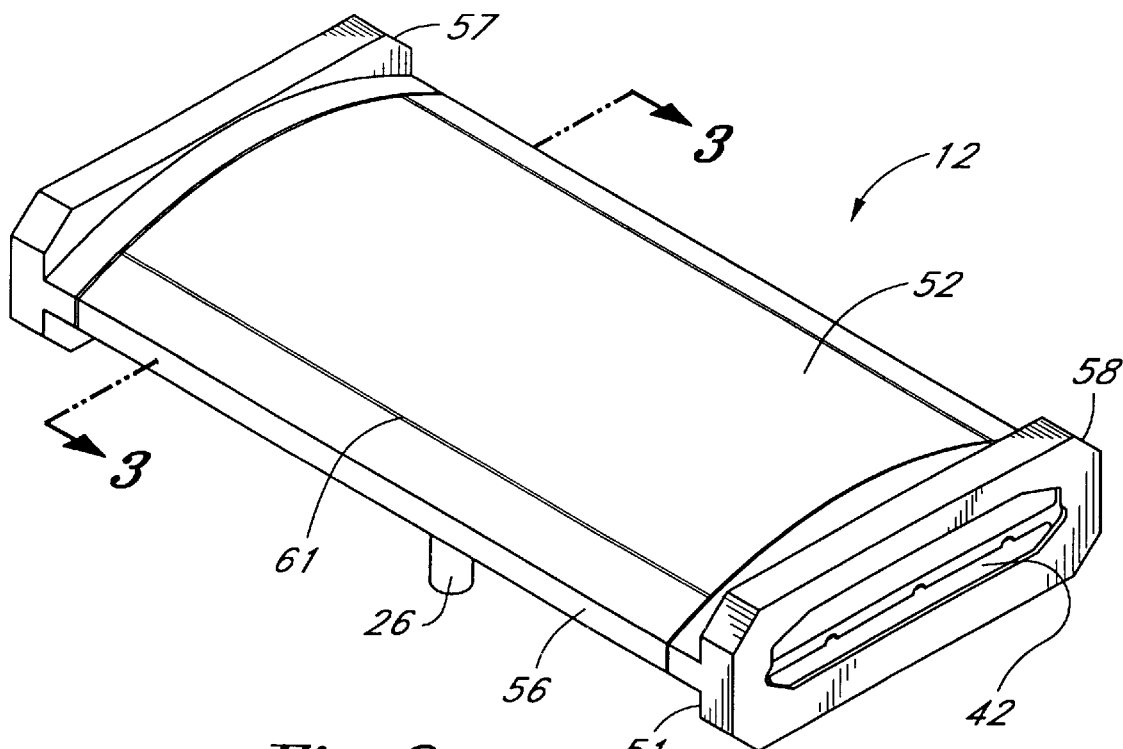
FIG. 2 is a perspective view of the exemplary reaction chamber of FIG. 1.
Figure 3:
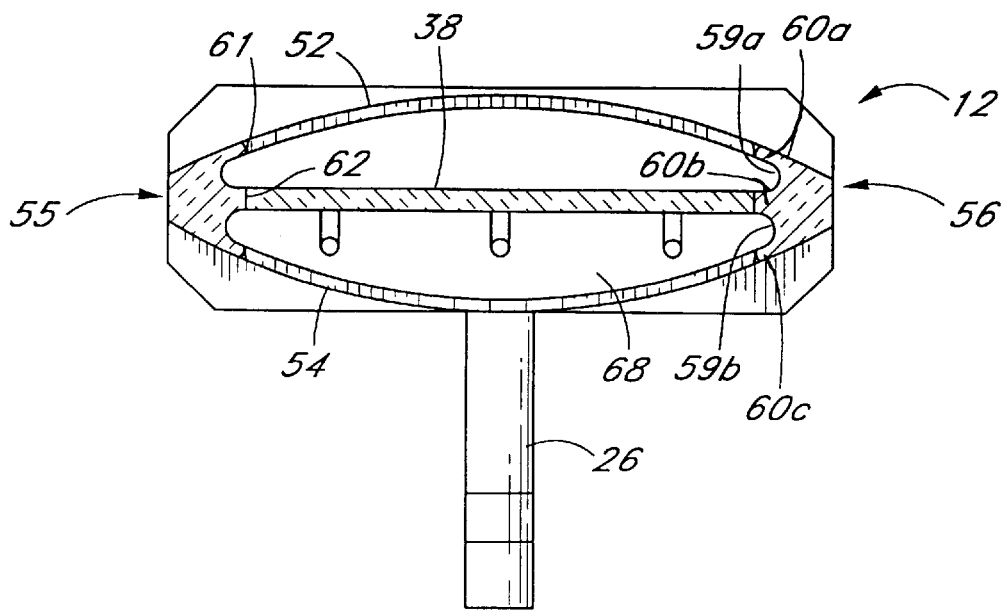
FIG. 3 is an end cross-sectional view of the chamber, taken along lines 3—3 of FIG. 2.

FIGS. 2 and 3 generally illustrate the three-dimensional configuration of the exemplary reaction chamber 12. As can be seen, the chamber 12 has a generally elongated, flattened configuration, which in cross-section has a generally lenticular shape with opposed bi-convex surfaces. The illustration chamber 12 is shown with a circular curvature in one dimension and no curvature in an orthogonal dimension. The chamber 12 has an upper wall 52 with an outer convex surface and an inner concave surface, and a lower wall 54 with an outer convex surface and an inner concave surface. The walls 52 and 54 are connected by vertically short side rails 55 and 56. These walls and side rails are further joined by an upstream inlet end flange 57 and a downstream outlet end flange 58.

Upstream and downstream relate to the direction of process gas flow, which will be taken to define a longitudinal direction for purposes of the present description. The gas flow path, of course, extends longitudinally between the chamber inlet 40 and outlet 42. The lateral direction, thus, extends between the short side rails 55 and 56. The height of the chamber 12 is defined in a vertical dimension, perpendicular to each of the longitudinal and lateral axes.

As best seen from FIG. 3, each of the upper wall 52 and the lower wall 54 comprise thin, curved elements having a regular curvature in the lateral dimension, and are illustrated as conforming to cylindrical surfaces. In the illustrated embodiment, each of the upper and lower walls 52 and 54 have a radius of curvature of approximately 24 inches, and a thickness of between about 4 mm and 6 mm, and more preferably about 5 mm. Although quartz is preferred, other materials having similar desirable characteristics may be substituted. Such characteristics include a high melting point, the ability to withstand large and rapid temperature changes, chemical inertness, and a high transparency to radiant energy or light.

Each of the side rails 55, 56 includes a reinforced main body with inner upper and lower recesses 59a and 59b which extend longitudinally the length of the side rails 55, 56. These recesses 59a, 59b define upper, middle and lower stub wall segments 60a, 60b and 60c, respectively. The upper and lower stub wall segments 60a, 60c extend into and mate with the lateral edges of the upper and lowerwalls 52, 54 at longitudinal weld joints 61. In the illustrated embodiment, the main body of the side rails 55, 56 has a thickness or width of about 20 mm and a height of about 21 mm.

The middle stub wall segments 60b extend inwardly and mate with the front chamber divider 36 and the rear chamber divider 38 (FIG. 1). Only the front chamber divider plate 36 is seen in the cross-section of FIG. 3. In the illustrated embodiment, the middle stub wall segments 60b are welded at longitudinal joints 62. Desirably, the middle stub wall segments 60b and the dividers 36, 38 bisect the chamber 12. Together with the ring 32 and wafer holder 20, this advantageously confines process gasses to an upper portion of the chamber. Moreover, the symmetry of the upper wall 52 above the divider plate and lower wall 54 below the divider plate, together with the welded construction of the side rails 16, 18, advantageously transfers inward and outward pressure upon the walls 52, 54 into lateral stresses within the plane of the divider plates 36, 38. The symmetry, thus, avoids bending or shear stresses upon the divider plates 36, 38, and the chamber 12 is able to withstand stresses from reduced or increased internal pressure.

Though not illustrated, each of the end flanges 57, 58 include inward extensions which mate with the upper wall 52 and the lower 54, as well as central inward extensions which mate with the divider plates 36, 38. The mating surfaces of these pieces can also be welded together. As previously noted, the outlet flange 58 defines the outlet port 42 of the process chamber 12, while the inlet flange 57 defines the inlet port 40 of the chamber 12.

Figure 4:
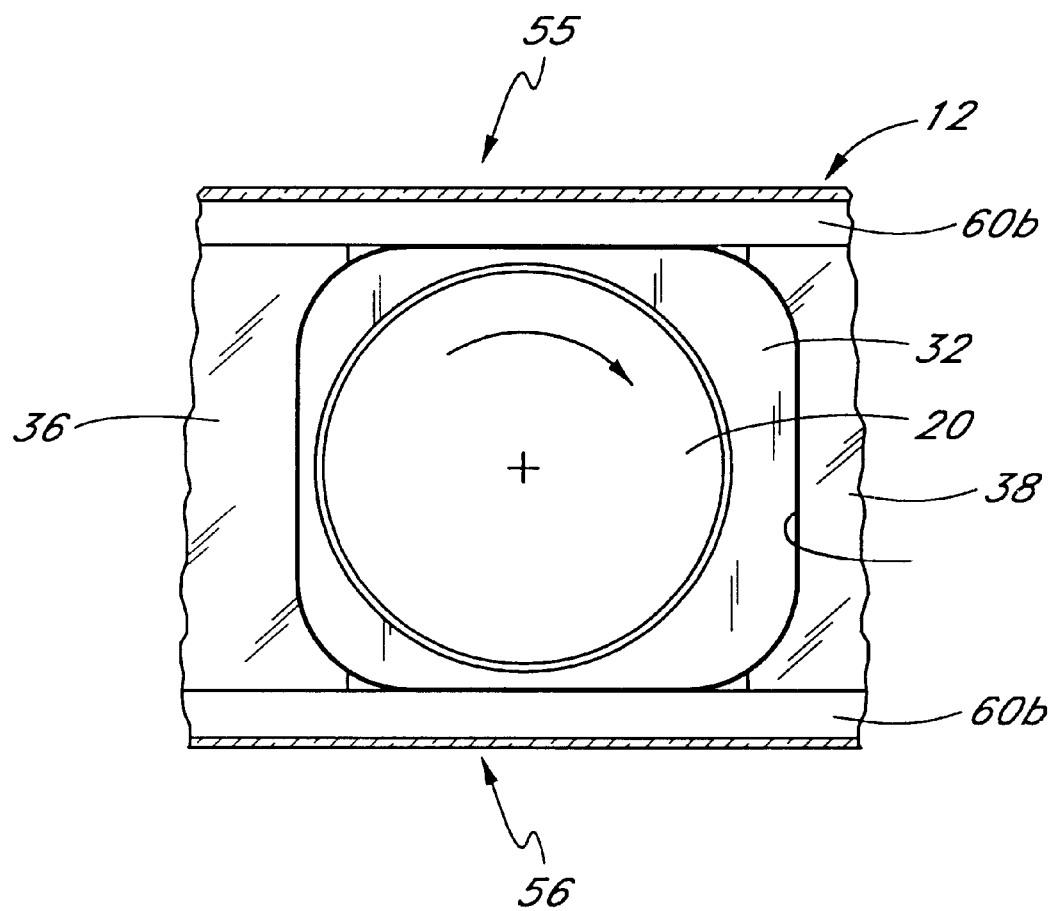
FIG. 4 is a partial top plan view of an interior portion of the chamber, showing a ring surrounding a rotatable wafer holder.

Referring now to FIG. 4, the front divider plate 36 and the rear divider plate 38, along with the middle stub wall segments 60*b* of the side rails 55, 56, define an opening configured to accommodate the ring 32 and a wafer holder 20. Desirably, the wafer holder 20 is adapted to rotate within the stationary ring 32, and is preferably spaced therefrom across a small annular gap of about 0.5 mm to 1.0 mm. While illustrated in FIG. 4 as generally rectangular with rounded edges, it will be understood that in other arrangements the ring 32 can also be made circular, in which case the opening defined by the divider plates 36, 38 should also be circular. In the illustrated embodiment, the portion of the ring 32 downstream of the wafer holder 20 has a greater surface area than the portion upstream of the wafer holder 20. Desirably, both the ring 32 and the wafer holder 20 comprise a material having high heat absorbency capable of withstanding thermal cycling, such as graphite or, more preferably, silicon carbide. Among other functions, the ring 32 tends to preheat processing gasses before it reaches the leading edge of the wafer holder 20 and, subsequently, the leading edge of the wafer 16. Desirably, the ring 32 closely conforms with. the edges of the divider plates 36, 38, and the upper and lower surfaces are flush with one another. Accordingly, the ring 30 presents no disruption to laminar gas flow, and the upper and lower portions of the chamber 12 are substantially sealed from one another.

The illustrated configuration for the chamber 12 advantageously permits structural support under even reduced pressure conditions with upper and lower walls 52, 54 having a thickness of only about 5 mm, while the divider plates needs only be about 10 mm thick. Other chamber dimensions include a lateral width of about 325 mm, a length between the end flanges 57, 58 of about 600 mm, and a height of the end flange of about 115 mm. These dimensions are designed for processing wafers of 200 mm diameters. One of ordinary skill in the art will readily appreciate that these dimensions can be changed for accommodating wafers of larger size, such as 300 mm or larger. Generally, proportionately changing all the dimensions will maintain the structural advantages of the illustrated embodiment. It will be understood, however, that this is merely a generalization and that alternative embodiments can deviate somewhat from the illustrated dimensions and ratios implicit therein.

The total volume capacity of single wafer process chambers designed for processing 200 mm wafers, for example, is preferably less than about 30 liters, more preferably less than about 20 liters, and is about 10 liters for the illustrated chamber 12. Because the chamber 12 is divided by the dividers 36, 38, wafer holder 20, ring 32, and the purge gas flowing from the tube 26, however, the effective volume through which process gases flow is around half the total volume (i.e., about 5.5 liters for the illustrated chamber 12). Of course, it will be understood that the volume of the single-wafer process chamber 12 can be different, depending upon the size of the wafers meant to be processed therein. For example, a 300 mm single-wafer processing chamber of the illustrated type generally has a capacity of less than about 100 liters, preferably less than about 60 liters, and more preferably less than about 30 liters. In one lenticular chamber designed to process 300 mm wafers, the volume is about 27 liters.

Exemplary Substrates

Figure 5:
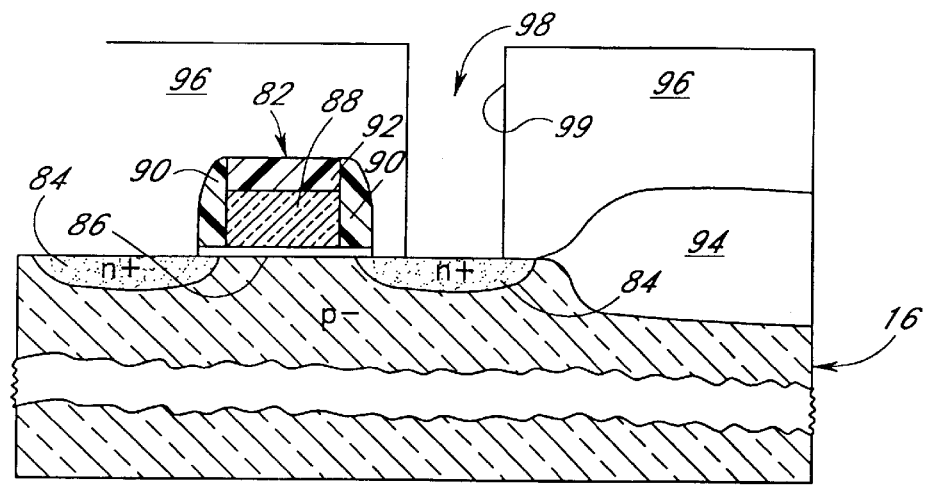
FIG. 5 is a schematic sectional view of a high aspect ratio via in a partially fabricated integrated circuit.

FIG. 5 illustrates a section of an exemplary substrate upon which a silicon layer is deposited, in accordance with the preferred embodiment. The substrate includes steep steps, which make it difficult to conformally cover with deposited material. As noted in the background section above, such steps may exist in partially fabricated integrated circuits. The disclosed deposition processes have particular utility when depositing into holes or other high aspect ratio structures, such as bench structures within a semiconductor wafer.

Figure 6:
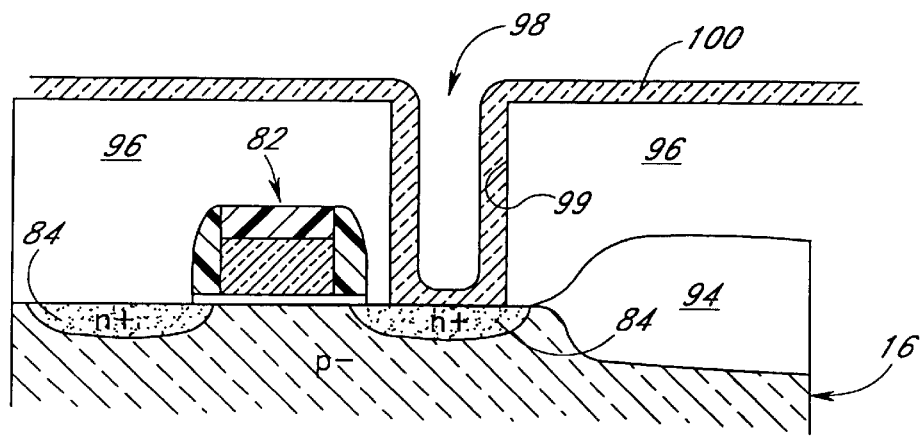
FIG. 6 is a view of the via of FIG. 5 after deposition of a thin silicon layer, in accordance with the preferred embodiment.
Figure 7:
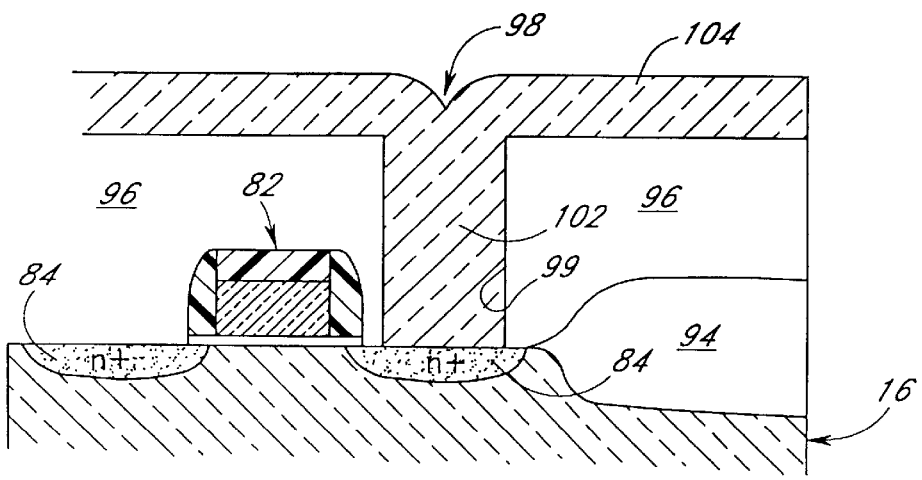
FIG. 7 is a view of the partially fabricated integrated circuit of FIG. 6, after continued deposition to fill the via, in accordance with the preferred embodiment.

In the illustrated embodiment, however, the substrate comprises the silicon wafer 16, including vias or trenches to be filled within structures of a partially fabricated integrated circuit. In FIGS. 5–7, an integrated tansistor is formed within and over single-crystal silicon. FIGS. 7A and 7B, on the other hand, illustrate a memory circuit trench capacitors.

The transistor of FIGS. 5–7 comprises a gate structure 82 formed between two active areas 84, which represent the source and drain regions of the transistor. The gate structure 82 includes a gate dielectric 86, a gate electrode 88, preferably comprising polysilicon, insulative side wall spacers 90, and a protective cap layer 92. The gate dielectric 86 generally comprises a thermal silicon dioxide layer, although other dielectric materials are also employed in the art. The gate electrode 88 preferably comprises polysilicon, which advantageously enables self-aligned formation of the source and drain regions 84, as will be understood by one of skill in the art. The insulative spacers 90 and protective cap layer 92 are generally formed of dielectric material, and are silicon nitride in the illustrated embodiment As noted, the source and drain regions may be formed in a self-aligned manner through dopant implantation or diffusion after the gate stack 82 has been formed. In the illustrated embodiment, the wafer 16 is shown with a low level of background p-type dopants, such that the active areas 84 are formed by heavily doping with n-type dopants. It will be understood, however, that the conductivity types may be reversed, and that PMOS or NMOS devices can be formed in different regions of the same wafer, in alternative arrangements. In any case, the heavily doped active areas 84 define a channel region of the transistor therebetween, below the transistor gate electrode 88.

A field oxide region 94 is also shown in FIG. 5. As is known in the art, field oxide may be formed by thermal oxidization, by trench fill, or by combinations of these techniques. The field oxide 94 serves to isolate electrical devices from one another.

The substrate of FIG. 5 is also shown with a relatively thick (e.g. 0.5 $\mu$m to 2.0 $\mu$m, and about 1.6 $\mu$m in the illustrated embodiment) insulating layer 96 covering the wafer 16 and transistor structure. The insulating layer 96 typically comprises a silicon oxide, such as borophososilicate glass (BPSG).

A contact opening or via 98 has been opened in the insulating layer 96 to expose one of the active areas 84. As is known in the art of integrated circuit fabrication, such a contact opening, hole or via 98 can be opened by a photolithographic and etching process. The illustrated contact via 98 is defined by generally vertical side walls 99, which may be cylindrical or rectangular in shape, depending upon the shape of the mask used to define the opening 98. It will also be understood that, in alternative arrangements, the side walls may be sloped and need not be vertical.

In accordance with the dictates of current-day integrated circuit designs, the illustrated via 98 has a high aspect ratio. Preferably, the opening of the via 98 has a diameter of less than about 1.0 $\mu$m, and is between about 0.7 $\mu$m to 0.8 $\mu$m in the illustrated embodiment. It will be understood, however, that the deposition processed below will have particular utility in filling holes of even smaller width, where openings will be less than about 0.5 $\mu$m, and particularly less than about 0.25 $\mu$m. Circuit designs using mask openings (which define the hole width) of less than 0.5 $\mu$m are known in the art as employing "half-micron" or "sub-half-micron"

technology, and "quarter-micron" technology similarly refers to designs employing mask openings of 0.25 µm and smaller. In quarter-micron technology, typical gate spacing is about 0.25 µm, while contacts vias are about 0.40 µm in diameter. The aspect ratio (depth to width) of the via 98 is thus preferably greater than 1:1, is greater than about 2:1 for the illustrated embodiment, and will be greater than 3:1 or even 5:1 for future circuit designs.

With reference to FIGS. 7A and 7B, trenches for the DRAM capacitors have widths typically 0.25 µm or below. DRAM circuit designs currently incorporate trench openings of about 0.18 µm, while future circuits will incorporate features of 0.15 µm, 0.13 µm, 0.10 µm, etc. Combined with trench depths of greater than about 5 µm, preferably greater than about 7 µm, and most preferably greater than about 10 µm, the aspect ratios of capacitor trenches can be significantly greater than those of contact vias. Preferably, DRAM capacitor trenches have aspect ratios of greater than about 10:1, more preferably greater than about 20:1, and are as high as 40:1 for current technology. As set forth below, the invention has been demonstrated to fill such high aspect ratio trenches, with in situ doping, with excellent step coverage.

Preferred Deposition Process

As noted in the "Background" section above, the commercial success of a process for depositing silicon can be measured by, on the one hand, the quality and step coverage of the resulting layer, and on the other hand, the deposition rate of the process. If the deposition is to take place within a single wafer chamber, such as the preferred process chamber 12 (FIG. 1), the rate of deposition is particularly important, since it has a greater effect on wafer throughput than the deposition rate in batch processors. While improving silicon deposition rates in single-wafer reactors is important, the commercial viability of any such process depends upon maintaining acceptable step coverage over current and future generation feature dimensions.

The conventional understanding of non-epitaxial (polycrystalline or amorphous) silicon deposition is that high step coverage can be achieved with low pressures during the process. Thus, even "high pressure" processes for depositing silicon are performed at well below atmospheric pressure levels. U.S. Pat. Nos. 5,607,724, 5,614,257, and 5,700,520, for example, disclose such "high pressure" depositions. The deposition rate has been increased by increasing the temperature of the process, but only at the expense of deteriorated step coverage. Moreover, incorporation of dopant gases into the process has traditionally deteriorated the coverage even further.

It has been found, however, that high rates of deposition can be achieved at high temperatures and high pressures, without the common deterioration of step coverage which has traditionally been observed at lower pressures.

In accordance with the preferred embodiment, the wafer 16, including a deep contact hole 98 as shown in FIG. 5, is loaded into the preferred reactor processor chamber 12. Wafers are preferably passed from a handling chamber (not shown), which is isolated from the surrounding environment, through the slot 45 by a pick-up device situated in the handling chamber. While a fork or paddle can serve as the handling device, the preferred pick-up device comprises a wand which shoots high velocity streams of gas at angles, as described in U.S. Pat. No. 4,846,102, the disclosure of which is hereby incorporated by reference. When brought close to the top of a wafer surface, the gas streams create a low pressure zone above the wafer, causing the wafer to lift. The handling chamber and the processing chamber 12 are preferably separated by a gate valve (not shown) of the type disclosed in U.S. Pat. No. 4,828,224, the disclosure of which is hereby incorporated by reference.

After the gate valve is closed, purged gas is preferably flowed through the chamber to remove any atmospheric contaminants. Desirably, hydrogen gases flow from the inlet port 40 to the outlet port 42, as well as through the depending tube 26 to the underside of the wafer holder 20 (see FIG. 1). An exemplary purge hydrogen flow is about 45 slm in processing area above the wafer 16, while a flow of between about 1 slm and 10 slm is flowed horizontally beneath the wafer 16. At the same time, between about 0.1 slm and 5 slm of purge gas can be flowed through the tube 26.

During purging, the temperature of the wafer 16 can be ramped to the desired process temperature by increasing power output to the lamps 13, 14, 15. Amorphous or polycrystalline silicon deposition is conducted between about 550° C. and 850° C.

In particular, if an amorphous silicon layer is desired, the temperature is preferably ramped to between about 550° C. and 650° C., and more preferably about 625° C. For rapidly depositing a polysilicon layer at the relatively high pressures disclosed herein, the temperature is preferably equal to or greater than about 650° C. and more preferably at greater than or equal to about 700° C. For undoped or lightly doped silicon, the presently described processes can achieve 100 nm/min deposition at about 650° C., while heavily As-doped silicon can achieve the same deposition rates at about 680° C. The temperature is preferably less than about 850° C. in either case, to avoid epitaxial deposition. It will be understood by one of skill in the art that conditions can also be selected to deposit a mixture of amorphous and polycrystalline silicon, where such a layer is desired for its electrical characteristics.

At the same time, the chamber 12 can be evacuated to a desired pressure level. The chamber 12 is maintained at above 100 Torr, preferably higher than about 500 Torr, more preferably higher than about 700 Torr, and is most preferably conducted at about atmospheric pressure (760 Torr). In the illustrated reactor 10 (FIG. 1), which can be operated without a vacuum pump, silicon deposition is conducted at close to atmospheric pressures (typically 700 Torr to 800 Torr). Slight pressure differentials due to gas flows are of negligible effect.

After the wafer 16 reaches the desired reaction temperature, and the chamber is set to the desired pressure level, process gases are then communicated to the inlet 46 in accordance with directions programmed into a central controller and distributed into the process chamber 12 through the injectors. These process gases then flow through the upper portion of the process chamber 12, that is, over the wafer 16, ring 32, and dividers 36, 38, and are drawn toward the outlet port 45. Unreacted process gases, carrier or diluent gases and any gaseous reaction by-products, are thus exhausted through the exhaust opening 49 and exhaust conduits 50.

Residence times of the process gases within the process chamber are kept relatively short. Residence times, as used herein, are defined as the volumetric process gas flow divided by the process volume at the relevant temperature. Preferably, process gas residence time in the reaction chamber 12 is less than about 100 seconds, more preferably less than about 60 seconds, and most preferably less than about 20 seconds.

Short residence times are facilitated by the design of the preferred reactor 10, which exhibits a substantially laminar single pass gas flow pattern over the wafer 16. Laminar single pass gas flow is to be distinguished, for example, from reactors utilizing intentional recirculation of process gases, or exhibiting recirculation as a result of buoyancy effects or chamber cross-sections which are not substantially uniform as seen along a gas flow path. Turbulence can be caused by protrusions in the gas flow, the structural design of the chamber or by differential thermal effects upon the gases in different chamber regions. It will be understood that laminar single pass gas flow can be accomplished by a process chamber having a longitudinal cross-section resembling that shown in FIG. 1, regardless of the lateral curvature. In particular, a non-recirculating gas flow path is established generally parallel to the wafer 16 surface. Preferably, the chamber 12 is divided such that process gas cannot flow below the wafer 16. Short residence times are also facilitated by high gas flow rates, accomplished by an abundant carrier gas flow, as will be understood from the process parameters set forth below.

Figure 1A:
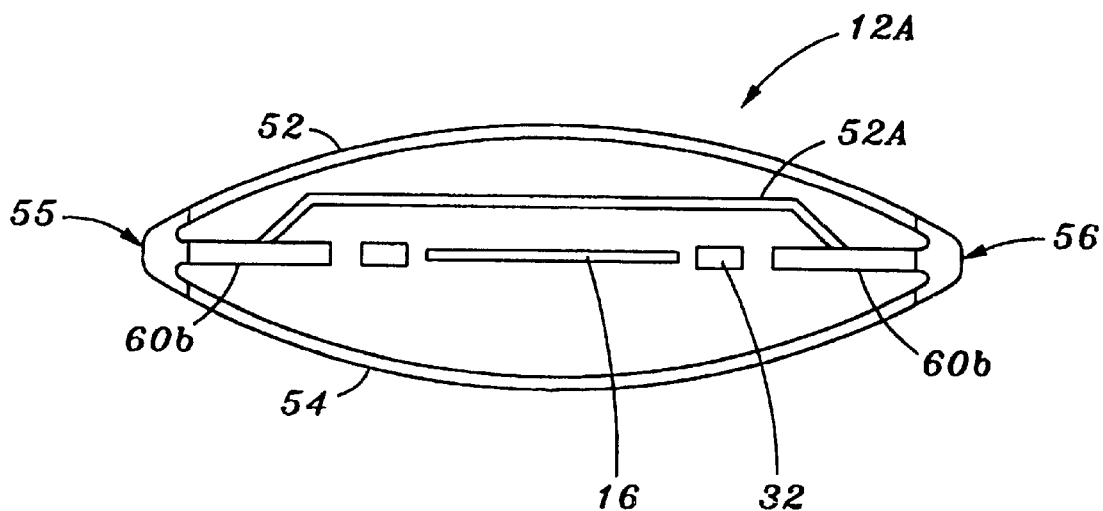
FIG. 1A is a schematic sectional view of an alternative single-wafer reaction chamber with a flow guide for promoting laminar gas flow.

Referring to FIG. 1A, an alternative chamber 12A is schematically illustrated in a lateral cross-section similar to that of FIG. 3, except taken across the wafer 16, with a flow guide 52A positioned within the chamber 12A. Since the chamber can be otherwise identical to that of FIGS. 1–4, like numerals are used to refer to like parts. It has been found that the flow guide 52A can be advantageously employed to further reduce residence times of the process gases by restricting the volume through which the process gases flow. At the same time, such a structure can promote uniformity of the deposited layer by further tailoring the gas flow. The illustrated flow guide 52A comprises plates formed of quartz. The length of the flow guide 52A and its position in the chamber can be chosen to tune the desired film properties without changing the cross-section of the main chamber 12A.

The carrier gas can comprise any of a number of known non-reactive gases, such as $N_2$, Ar, etc. More preferably, however, $H_2$ is used as the carrier gas in the preferred process. Use of hydrogen carriers has traditionally been avoided for polysilicon deposition due to safety concerns and lower deposition rates compared to processes using $N_2$. It has been found, however, that hydrogen is advantageous in that it introduces fewer contaminants into the chamber 12 and onto the wafer 16, and furthermore facilitates better temperature control and reduced deposits on internal chamber wall surfaces. Moreover, without being limited by theory, it is believed that hydrogen inhibits formation of higher silanes (e.g., $SiH_2$, $Si_2H_6$, etc.) which would otherwise too quickly deposit at and close off the openings of trenches or holes prior to complete fill. In particular, for one chamber with a gas flow path of approximately 2" by 10" in cross-section (for a 200 mm wafer) is preferably operated with greater than about 5 slm, preferably greater than about 10 slm of the carrier gas, and in particular about 20 slm to 60 slm.

The process gases include at least one silicon source gas. As noted above, preferred silicon source gases include any of the silane or chlorosilane gases listed above. The illustrated use of monosilane in combination with hydrogen carrier gas has been found particularly advantageous in filling high aspect ratio voids with excellent step coverage and high rates. The flow rate of the silicon source gas depends upon process pressures, but is preferably between about 100 sccm and 2,000 sccm, more preferably between about 300 sccm and 700 sccm.

Most preferably, the process flow includes a dopant gas to effect deposition of an in situ doped conductive silicon layer. For an n-type layer, to make contact with the illustrated n-type active area 84 (FIG. 5), either arsine ($AsH_3$) or phosphine ($PH_3$) is added to the process flow. If a p-type layer is desired, diborane can be added to the flow. As will be understood by one of ordinary skill in the art, dopants are preferably introduced in a mixture with a nonreactive gas, that is, a gas which does not react with the dopant gas. In the illustrated embodiment, the dopants are introduced in a 1% mixture with $H_2$, and this mixture can be flow at between 1 sccm and 200 sccm, depending on other process parameters, desired resistivity and desired growth rates. In general, higher dopant flow (relative to silicon source gas flow) entails lower resistivities and lower growth rates (to a point), and additionally degrades step coverage. While LPCVD has traditionally exhibited deterioration of deposition rates by as much as an order of magnitude upon introduction of dopant into the deposition, the presently described atmospheric, hydrogen/silane deposition processes exhibit a reduction of deposition rates by a factor of only 2.5 for arsenic doping, and even higher deposition rates for phosphorus doping.

FIG. 6 schematically illustrates the exemplary wafer 16 after silicon has been deposited by the preferred process, resulting in a silicon layer 100. An exemplary process for contact fill includes flowing about 350 sccm of $SiH_4$, 14 slm of $H_2$, and 20 sccm of the 1% $PH_3$ mixture, with the substrate heated to about 650° C. Despite the small opening and relatively greater depth of the illustrated contact hole 98, the resultant silicon layer 100 exhibits excellent step coverage or conformality into the hole 98. In particular, the silicon layer 100 exhibited 86% step coverage, where "step coverage" is measured as the ratio of the thickness of the silicon 100 over the vertical hole side walls 99 to the thickness over the top surface of the insulating layer 96.

FIG. 7 illustrates the result of continuing the deposition into the contact hole 98. As illustrated, the preferred deposition process results in a completely filled contact hole 98, producing a silicon contact plug 102 and an overlying layer of silicon 104. Moreover, in accordance with the preferred process, both the silicon plug 102 and overlying layer 104 are in situ doped such that a post-formation doping step is not required in order to make these structures conductive. In situ doping also has the advantage that the dopant concentration is substantially uniform in the hole, which can avoid a high temperature diffusion step. The overlying layer 104, can thus serve as a portion of an interconnect layer.

As noted earlier, the preferred deposition methods are particularly advantageous for filling trench capacitors, as illustrated in FIGS. 7A and 7B. As shown, such a trench can be lined with a dielectric layer and then filled with conductive polysilicon by the preferred methods. The openings of such trenches can be under 0.25 $\mu$m, and is less than or equal to about 0.18 $\mu$m in the illustrated embodiment. As will be understood by one of ordinary skill in the art, such narrow, deep trenches can be difficult to fill with conductive polysilicon without void formation. The processes of the present invention, however, can accomplish such filling at relatively high rates of deposition and good step coverage, thus avoiding void formation and improving yield.

FIG. 7B illustrates actual aspect ratios for capacitor trenches 100, formed in a semiconductor substrate 102 and filled with doped polysilicon 101 in accordance with an exemplary process of the invention. The depth of the trenches 100 varied from about 7.5 $\mu$m to 8 $\mu$m. The trench width was about 330 mn near the surface of the substrate 102, widening slightly before tapering to about 150 nm near the bottom. The trenches are lined with a thin capacitor dielectric 104 prior to filling. Table I, below, sets forth the process recipe actually used to completely fill the trenches of FIG. 7B.

TABLE I

| Process Step | Time (s) | Temp. (° C.) | H$_2$ (slm) | N$_2$ (slm) | SiH$_4$ (sccm) | 1% AsH$_3$ in H$_2$ (sccm) | Pressure (Torr) |
|---|---|---|---|---|---|---|---|
| (1) Stabilization | 40 | 650 | 14 | — | — | — | 760 |
| (2) Doped poly | 126 | 650 | 14 | — | 480 | 20 | 760 |
| (3) Undoped poly | 20 | 650 | 14 | — | 480 | — | 760 |
| (4) Purge H$_2$ | 60 | 650 | 30 | — | — | — | 760 |
| (5) Purge N$_2$ | through wafer unload | 650 | — | 50 | — | — | 760 |

In addition to the above parameters, purge about 1 slm was flowed horizontally beneath the wafer 16, and about 1 slm of purge gas was flowed through the tube 26 (see FIG. 1) throughout the process. The wafer holder 20 rotated at a rate of about 30 rpm as well.

The doped poly step produced a heavily doped polysilicon layer of about 50 nm initially. The subsequent undoped poly step completed the deposition to bring the total deposition to about 300 nm. As noted above, undoped polysilicon can be deposited more quickly than in situ doped polysilicon, thereby speeding the overall process. Subsequent anneal steps (not illustrated) served to both stabilize sheet resistance and diffuse the heavy dopant profile from the initial poly throughout the polysilicon fill. For example, the deposited layer can be annealed at about 1050° C. for about 40 seconds in an O$_2$ atmosphere. Similar deposition conditions on a monitor wafer demonstrated sheet resistance of about 201 Ω/□.

Further exemplary processes and theoretical analysis of the present atmospheric, hydrogen/silane polysilicon deposition processes are provided in C. Pomaréde et al, "Trench and Contact Fill With In-Situ Doped Polysilicon Using An Atmospheric Pressure RTCVD Process" PROC. of THE 6$^{TH}$ INTERN. CONF. ON ADV. THERM. PROC. OF SEMICOND. —RTP98 (1998), edited by T. Hori et al., pp. 120–125. The disclosure of this article is expressly incorporated herein by reference.

In general, the high pressure, high temperature processes of the preferred embodiment result in extraordinarily high step coverage, while at the same time achieving commercially-acceptable rates of deposition. Furthermore, fast and high quality deposition can be maintained even with in situ doping for conductivity, thus saving the need for post-deposition doping and generally allowing better dopant distributions. In particular, doping rates are preferably maintained at greater than about 50 nm/min, preferably higher than about 60 nm/min, and have been demonstrated to exhibit deposition rates of greater than about 100 nm/min. Step coverage with the preferred processes is preferably greater than about 70%, more preferably greater than about 80%, and is most preferably greater than about 85%. As demonstrated in the Table II below, step coverage of greater than even 90% can be accomplished by the disclosed processes while ng deposition rates of greater than 50 nm/min Table II below illustrates a variety of parameter variations and deposition results over trench structures in semiconductor wafers. In particular, trenches such as those commonly used for forming capacitors in dynamic random access memory arrays (DRAMs) were lined with 200 nm to 300 nm of silicon by the disclosed processes. The trenches were about 10 μm deep and range from 0.3 μm to 1.8 μm in width. For many deposition parameter sets, deposition rates and resistivities were obtained from one wafer with the given parameter set, and step coverage was determined on a different wafer (having holes) with the same parameter set. Such data points are combined in Table II for convenience. Accordingly, rows in Table II showing deposition rates and/or resistivities as well as step coverage in reality represent data obtained from two separate wafers.

TABLE II

| Temp. (° C.) | Press. (Torr) | H$_2$ (slm) | SiH$_4$ (sccm) | AsH$_3$ 1%/H$_2$ (sccm) | Dep. Rate (nm/min) | Resistiv. (μΩ · cm) | Hole Width (nm) | Step Coverage |
|---|---|---|---|---|---|---|---|---|
| 580 | 760 | 5 | 450 | 1 | 24.2 | 16,888 | | |
| 580 | 760 | 5 | 450 | 2.96 | | | 1160 | 92% |
| 580 | 760 | 5 | 450 | 2.96 | | | 820 | 89% |
| 580 | 760 | 5 | 450 | 2.96 | | | 1040 | 90% |
| 580 | 760 | 5 | 450 | 10 | 22.4 | 2045 | | |
| 600 | 760 | 5 | 450 | 2.96 | 40.4 | 3868 | 760 | 72% |
| 620 | 760 | 5 | 450 | 2.96 | | | 1010 | 96% |
| 620 | 760 | 5 | 450 | 2.96 | | | 540 | 76% |
| 650 | 760 | 5 | 225 | 1.48 | | | 450 | 90% |
| 650 | 760 | 5 | 450 | 6.42 | 134.9 | 9296 | 430 | 74% |
| 650 | 760 | 5 | 450 | 6.42 | | | 640 | 90% |
| 650 | 760 | 5 | 450 | 6.42 | | | 890 | 72% |
| 650 | 760 | 7 | 175 | 0.5 | 53.3 | 40189 | | |
| 650 | 760 | 7 | 175 | 1.15 | | | 540 | 81% |
| 650 | 760 | 7 | 175 | 1.15 | | | 560 | 78% |
| 650 | 760 | 7 | 175 | 1.15 | | | 780 | 76% |
| 650 | 760 | 10 | 450 | 2.96 | 108.1 | 11451 | 900 | 77% |
| 650 | 760 | 14 | 350 | | 86.1 | | 560 | 79% |
| 650 | 760 | 14 | 350 | | 86.1 | | 770 | 84% |
| 650 | 760 | 14 | 350 | | 86.1 | | 630 | 86% |
| 650 | 760 | 14 | 350 | | 86.1 | | 700 | 83% |
| 650 | 760 | 14 | 350 | 2.3 | 70.1 | 7796 | 460 | 79% |

TABLE II-continued

| Temp. (° C.) | Press. (Torr) | H$_2$ (slm) | SiH$_4$ (sccm) | AsH$_3$ 1%/H$_2$ (sccm) | Dep. Rate (nm/min) | Resistiv. ($\mu\Omega \cdot$ cm) | Hole Width (nm) | Step Coverage |
|---|---|---|---|---|---|---|---|---|
| 650 | 760 | 14 | 350 | 2.3 | 70.1 | 7796 | 550 | 83% |
| 650 | 760 | 14 | 350 | 5 | 62.5 | 3285 | 770 | 91% |
| 650 | 760 | 14 | 350 | 5 | 62.5 | 3285 | 810 | 92% |
| 650 | 760 | 14 | 350 | 20 | 35.8 | 1382 | 760 | 68% |
| 650 | 760 | 14 | 350 | 20 | 35.8 | 1382 | 520 | 67% |
| 650 | 760 | 14 | 350 | 20 | 35.8 | 1382 | 910 | 67% |
| 650 | 760 | 14 | 350 | 5 | 74.6 | 18815 | 490 | 71% |
| 650 | 760 | 14 | 350 | 0 | | | 590 | 76% |
| 650 | 760 | 14 | 350 | 0 | | | 440 | 65% |
| 650 | 760 | 14 | 350 | 0 | | | 760 | 71% |
| 650 | 760 | 14 | 450 | 6.42 | 81.2 | 3258 | 740 | 82% |
| 650 | 760 | 14 | 450 | 6.42 | 81.2 | 3258 | 850 | 89% |
| 650 | 760 | 14 | 450 | 6.42 | 81.2 | 3258 | 550 | 90% |
| 650 | 760 | 28 | 350 | 1 | 47.7 | 15729 | | |
| 650 | 760 | 28 | 350 | 2.3 | | | 730 | 87% |
| 700 | 760 | 14 | 350 | 5 | 218.8 | 33484 | 790 | 72% |
| 700 | 760 | 14 | 350 | 5 | 218.8 | 33484 | 920 | 86% |
| 700 | 760 | 28 | 350 | 5 | 138.0 | 31893 | 820 | 86% |
| 700 | 760 | 28 | 350 | 5 | 138.0 | 31893 | 820 | 96% |
| 700 | 760 | 28 | 350 | 5 | 138.0 | 31893 | 470 | 83% |
| 700 | 760 | 42 | 350 | 2.3 | 104.4 | 103792 | 820 | 78% |
| 700 | 760 | 42 | 350 | 2.3 | 104.4 | 103792 | 1720 | 91% |
| 700 | 760 | 42 | 350 | 10 | 57.6 | 10791 | 700 | 92% |
| 700 | 760 | 42 | 350 | 0 | 122.3 | | 920 | 94% |
| 700 | 760 | 42 | 350 | 10 | 102.6 | 322776 | | |
| 650 | 40 | 4 | 450 | 6.42 | 36.3 | 3784 | 470 | 47% |
| 659 | 40 | 4 | 450 | 6.42 | 36.3 | 3784 | 770 | 53% |
| 650 | 40 | 4 | 450 | 6.42 | 36.3 | 3784 | 780 | 73% |
| 650 | 40 | 4 | 450 | 6.42 | 36.3 | 3784 | 480 | 58% |
| 650 | 40 | 5 | 350 | 1 | 42.8 | 14564 | | |
| 650 | 40 | 5 | 350 | 2.3 | | | 530 | 74% |
| 650 | 40 | 5 | 350 | 2.3 | | | 860 | 77% |
| 650 | 40 | 5 | 350 | 5 | 24.1 | 5789 | | |

From the above table, one of ordinary skill in the art will readily appreciate the following generalized conclusions, holding other parameters constant: (1) reducing pressure deteriorates both deposition rate and step coverage; (2) increasing arsine flow reduces deposition rate and step coverage; (3) high flow rates enhances deposition rates without deteriorating step coverage; and (4) good step coverage and high deposition rates can be obtained at high temperatures (e.g., 700° C.) and high flow rates. One of ordinary skill in the art can readily apply these teachings to arrive at advantageous deposition parameters for a given set of needs, in light of the disclosure herein. For example, a skilled artisan set minimum acceptable step coverage needs and the degree of resistivity and determine the temperature, pressure and flow rates which will accomplish the needs at the highest rate of deposition.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by to the dependent claims.

We claim:

1. A method of depositing a non-epitaxial silicon layer on a substrate within a reaction chamber at a pressure of a greater than about 500 Torr, comprising flowing process gases through the reaction chamber and over the substrate at a desired reaction temperature, with a process gas residence time in the reaction chamber of less than about 100 seconds.

2. The method of claim 1, wherein the residence time is less than about 60 seconds.

3. The method of claim 2, wherein the residence time is less than about 20 seconds.

4. The method of claim 1, wherein the pressure is greater than about 700 Torr.

5. The method of claim 1, wherein the reaction chamber comprises a single-wafer horizontal reaction chamber having a constant height above the wafer in a cross-section taken along a gas flow axis.

6. The method of claim 5, wherein the reaction chamber is vertically divided by a horizontal divider plate upstream and downstream of the substrate, the divider plate approximately in the plane of the substrate.

7. The method of claim 1, wherein the process gases comprise silane and hydrogen.

8. A process for depositing a non-epitaxial silicon layer by chemical vapor deposition, comprising:
   placing a substrate into a single-wafer processing reaction chamber;
   raising the temperature of the substrate to a reaction temperature between about 625° C. and 850° C.;
   introducing process gases including a silicon source gas and a hydrogen carrier gas to the reaction chamber; and
   flowing the process gases over the substrate while maintaining the reaction chamber at a pressure of greater than about 700 Torr.

9. The process of claim 8, wherein polysilicon is deposited at a rate of at least about 50 nm/min.

10. A method of depositing silicon by chemical vapor deposition, comprising:
    loading a semiconductor substrate into a reaction chamber, the substrate including a plurality of holes therein, the holes having openings of no more than about 0.5 $\mu$m and aspect ratios of greater than about 2:1;
    ramping the substrate temperature to a desired reaction temperature;

maintaining a pressure of greater than about 700 Torr in the reaction chamber; and flowing a silane-based silicon source gas, a hydrogen carrier gas, and a dopant source gas simultaneously over the substrate within the reaction chamber at the desired reaction temperature, thereby depositing an in situ conductively doped silicon layer over the substrate and into the holes, wherein the silicon layer exhibits greater than about 70% step coverage of the holes.

11. The method of claim 10, wherein the silicon layer exhibits greater about 80% step coverage of the holes.

12. The method of claim 10, wherein the silicon layer exhibits greater about 85% step coverage of the holes.

13. The method of claim 12, wherein the silicon layer exhibits greater about 90% step coverage of the holes.

14. The method of claim 10, wherein the desired reaction temperature is greater than about 650° C.

15. The method of claim 14, wherein the desired reaction temperature is less than about 700° C.

16. The method of claim 10, wherein the silicon source gas comprises monosilane.

17. The method of claim 10, wherein the holes have an aspect ratio of greater than about 5:1.

18. The method of claim 10, wherein the holes have an aspect ratio of greater than about 10:1.

19. The method of claim 10, wherein the holes have an aspect ratio of greater than about 20:1.

20. The method of claim 10, wherein the holes have an aspect ratio of greater than about 40:1.

21. The method of claim 10, wherein the deposited silicon layer incorporates arsenic.

22. The method of claim 10, wherein depositing the silicon layer comprises growing the layer at greater than about 50 nm/min.

23. The method of claim 10, wherein depositing the silicon layer comprises growing the layer at greater than about 100 nm/min.

24. A method of forming an integrated circuit, comprising:

providing a substrate with a hole having greater than a 2:1 aspect ratio;

loading the substrate into a single-wafer processing chamber;

depositing silicon into the hole at a rate of at least about 50 nm/min with greater than about 80% step coverage.

25. The method of claim 24, wherein depositing silicon comprises flowing silane in a hydrogen carrier gas.

26. The method of claim 24, wherein the aspect ratio of the hole is greater than about 5:1.

27. The method of claim 26, wherein the aspect ratio of the hole is greater than about 10:1.

28. The method of claim 27, wherein depositing silicon includes in situ doping.

29. The method of claim 28, wherein in situ doping comprises flowing arsine.

30. The method of claim 29, wherein depositing silicon comprises maintaining the chamber at a pressure greater than about 500 Torr.

31. The method of claim 30, wherein depositing silicon comprises maintaining the chamber at about atmospheric pressure.

32. The method of claim 31, wherein flowing said hydrogen carrier gas and silane comprises maintaining a reactant residence time in the reaction chamber of less than about 100 seconds.

* * * * *

UNITED STATES PATENT AND TRADEMARK OFFICE
CERTIFICATE OF CORRECTION

PATENT NO.     : 6,232,196 B1
DATED          : May 15, 2001
INVENTOR(S)    : Raaijmakers et al.

It is certified that error appears in the above-identified patent and that said Letters Patent is hereby corrected as shown below:

<u>Column 8,</u>
Line 6, please replace "bench" with -- trench --.
Line 10, please replace "tansistor" with -- transistor --.

Signed and Sealed this

Twenty-fifth Day of February, 2003

JAMES E. ROGAN
*Director of the United States Patent and Trademark Office*